(12) United States Patent
Suga et al.

(10) Patent No.: US 10,319,658 B2
(45) Date of Patent: Jun. 11, 2019

(54) ELECTRONIC COMPONENT PACKAGE AND METHOD OF HOUSING AN ELECTRONIC COMPONENT

(71) Applicant: Taiyo Yuden Co., Ltd., Tokyo (JP)

(72) Inventors: Yasutomo Suga, Tokyo (JP); Masataka Watabe, Tokyo (JP)

(73) Assignee: Taiyo Yuden Co., Ltd, Tokyo (JP)

( * ) Notice: Subject to any disclaimer, the term of this patent is extended or adjusted under 35 U.S.C. 154(b) by 21 days.

(21) Appl. No.: 15/885,129

(22) Filed: Jan. 31, 2018

(65) Prior Publication Data

US 2018/0218958 A1 Aug. 2, 2018

(30) Foreign Application Priority Data

Feb. 2, 2017 (JP) ................................ 2017-017947

(51) Int. Cl.
| | |
|---|---|
| *H01L 23/31* | (2006.01) |
| *H05K 3/30* | (2006.01) |
| *H01G 4/232* | (2006.01) |
| *H01L 21/56* | (2006.01) |
| *H01G 4/12* | (2006.01) |

(52) U.S. Cl.
CPC ....... *H01L 23/3192* (2013.01); *H01G 4/1209* (2013.01); *H01G 4/1272* (2013.01); *H01G 4/232* (2013.01); *H01L 21/568* (2013.01); *H01L 23/3114* (2013.01); *H05K 3/303* (2013.01)

(58) Field of Classification Search
CPC ............. H01L 23/3192; H01L 23/3114; H01L 21/568; H01G 4/1272; H01G 4/1209; H01G 4/232; H05K 3/303

USPC ........................................................ 361/728
See application file for complete search history.

(56) References Cited

U.S. PATENT DOCUMENTS

| | | | | |
|---|---|---|---|---|
| 7,499,258 | B2 * | 3/2009 | Shim ........................ | H01G 2/06 361/307 |
| 9,530,561 | B2 * | 12/2016 | Fujita ....................... | H01G 4/30 |
| 2011/0266040 | A1 * | 11/2011 | Kim ......................... | H01G 4/005 174/260 |
| 2014/0185189 | A1 | 7/2014 | Kim et al. | |
| 2014/0321029 | A1 * | 10/2014 | Djebara ................. | H01G 9/052 361/525 |
| 2015/0049412 | A1 * | 2/2015 | Kim ......................... | H01G 4/30 361/301.4 |
| 2015/0092343 | A1 * | 4/2015 | Rich ...................... | H01G 11/10 361/679.54 |

(Continued)

FOREIGN PATENT DOCUMENTS

JP 2014-130999 A 7/2014

*Primary Examiner* — Rockshana D Chowdhury
(74) *Attorney, Agent, or Firm* — Saliwanchik, Lloyd & Eisenschenk

(57) ABSTRACT

An electronic component package includes: an electronic component that includes a body, the body having a first main surface that is convexly curved along a longitudinal direction, and a second main surface that is concavely curved along the longitudinal direction, a distance between the first main surface and the second main surface being 50 μm or less; a housing portion that includes a plurality of recesses, each of the recesses including a take-out opening and housing the electronic component with the first main surface facing toward the take-out opening; and a sealing portion that covers the take-out openings of the plurality of recesses.

6 Claims, 9 Drawing Sheets

(56) References Cited

U.S. PATENT DOCUMENTS

2015/0348712 A1* 12/2015 Lee .................. H01G 4/30
                                              174/260

* cited by examiner

ELECTRONIC COMPONENT PACKAGE AND METHOD OF HOUSING AN ELECTRONIC COMPONENT

CROSS-REFERENCE TO RELATED APPLICATION

This application claims the benefit under 35 U.S.C. § 119 of Japanese Patent Application No. 2017-017947, filed Feb. 2, 2017, the disclosure of which is herein incorporated by reference in its entirety.

BACKGROUND

The present invention relates to an electronic component package and a method of housing an electronic component in a package.

In recent years, along with miniaturization of electronic devices, there have increasingly been demands for reduction in height of multi-layer ceramic electronic components used in the electronic devices. Meanwhile, such multi-layer ceramic electronic components have a disadvantage in that strength is lowered due to the reduction in height.

In this regard, for example, Japanese Patent Application Laid-open No. 2014-130999 (hereinafter, referred to as Patent Document 1) discloses a technique of making external electrodes thinner and making a ceramic body thicker accordingly in order to ensure strength of a multi-layer ceramic capacitor whose height is reduced.

SUMMARY

In the multi-layer ceramic capacitor described in Patent Document 1, however, as the ceramic main body becomes thinner, it is more difficult to ensure the strength of the body even when the external electrodes are made thinner.

For that reason, the multi-layer ceramic capacitor described in Patent Document 1 may be damaged when the multi-layer ceramic capacitor is taken out of a package by use of a chip mounter or the like and then mounted onto a substrate or the like in an assembling step of a circuit board and the like.

In view of the circumstances as described above, it is desirable to provide a package that houses an electronic component in which both of reduction in height and ensuring of strength are achieved, and a method of housing the electronic component in a package.

According to an embodiment of the present invention, there is provided an electronic component package including an electronic component, a housing portion, and a sealing portion.

The electronic component includes a body, the body having a first main surface that is convexly curved along a longitudinal direction, and a second main surface that is concavely curved along the longitudinal direction, a distance between the first main surface and the second main surface being 50 µm or less.

The housing portion includes a plurality of recesses, each of the recesses including a take-out opening and housing the electronic component with the first main surface facing toward the take-out opening.

The sealing portion covers the take-out openings of the plurality of recesses.

In this configuration, the electronic component is housed in the recess with the convexly-curved first main surface facing toward the take-out opening. This improves flexural strength of the electronic component against stress applied from the first main surface side, although the electronic component has a low-profile configuration.

Therefore, according to the present invention, it is possible to provide an electronic component package that houses an electronic component in which both of reduction in height and ensuring of strength are achieved.

The electronic component may include a ceramic electronic component.

The ceramic electronic component may include a multi-layer ceramic electronic component that is made of insulating ceramics and includes a first cover and a second cover, the first cover forming the first main surface, the second cover forming the second main surface.

An angle formed by tangent lines that are tangent to ends of the first main surface in the longitudinal direction may be 170° or more and 176° or less.

The first cover and the second cover may be different from each other in particle density of the insulating ceramics.

The first cover and the second cover may be different from each other in particle diameter of the insulating ceramics.

The first cover and the second cover may be different from each other in content of an additive element therein.

The additive element may be at least one element selected from magnesium, manganese, aluminum, calcium, vanadium, chromium, zirconium, molybdenum, tungsten, tantalum, niobium, silicon, boron, yttrium, europium, gadolinium, dysprosium, holmium, erbium, ytterbium, lithium, potassium, and sodium.

The housing portion may include a carrier tape.

The sealing portion may include a cover tape.

According to another embodiment of the present invention, there is provided a method of housing an electronic component, the method including: preparing a housing portion that includes a plurality of recesses, each of the recesses including a take-out opening; preparing a plurality of electronic components, each of the electronic components including a body having a first main surface convexly curved along a longitudinal direction and a second main surface concavely curved along the longitudinal direction, a distance between the first main surface and the second main surface being 50 µm or less; and housing the plurality of electronic components individually in the plurality of recesses such that each first main surface faces toward the take-out opening corresponding thereto.

In the housing method described above, the electronic component is housed in the recess with the convexly-curved first main surface facing toward the take-out opening. This improves the flexural strength of the electronic component against stress applied from the first main surface side.

Therefore, according to the present invention, when an electronic component including a body whose height is reduced is housed in the recess by the housing method described above, the electronic component package is provided with a configuration to house the electronic component in which both of reduction in height and ensuring of strength are achieved.

It is possible to provide a package that houses an electronic component in which both of reduction in height and ensuring of strength are achieved, and a method of housing the electronic component in a package.

These and other objects, features and advantages of the present invention will become more apparent in light of the following detailed description of embodiments thereof, as illustrated in the accompanying drawings.

DETAILED DESCRIPTION OF EMBODIMENTS

Hereinafter, embodiments of the present invention will be described with reference to the drawings.

In the figures, an X axis, a Y axis, and a Z axis orthogonal to one another are shown as appropriate. The X axis, the Y axis, and the Z axis are common in all figures.

1. Configuration of Multi-layer Ceramic Capacitor Package 100

Figure 1:
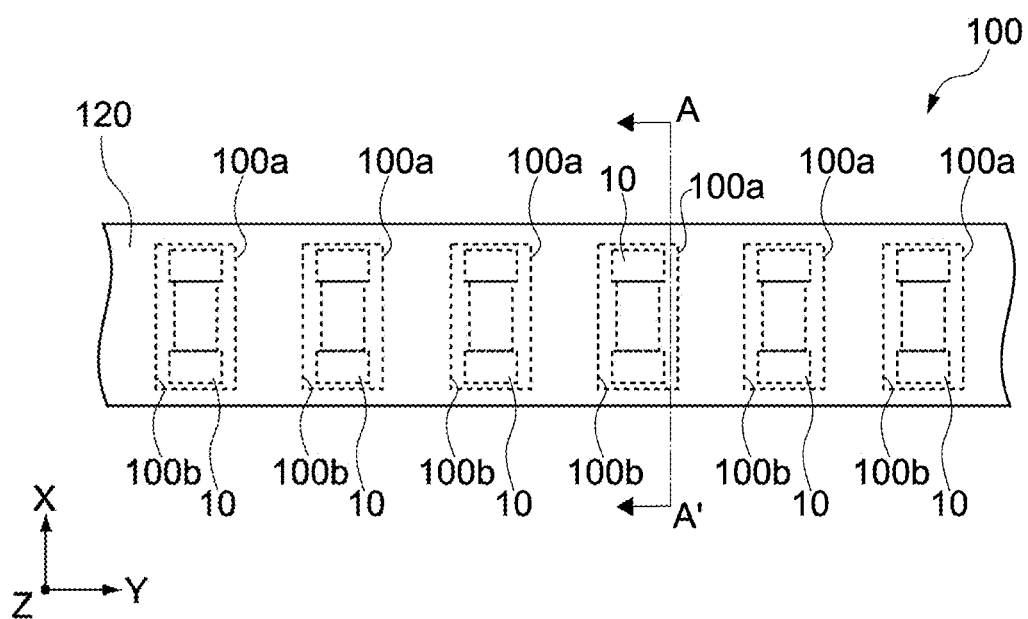
FIG. 1 is a plan view of a multi-layer ceramic capacitor package according to an embodiment of the present invention.
Figure 2:
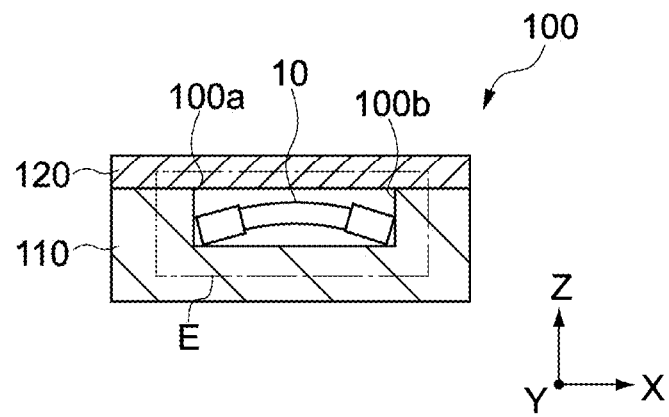
FIG. 2 is a cross-sectional view of the multi-layer ceramic capacitor package taken along the A-A' line in FIG. 1.

FIG. 1 is a plan view of a multi-layer ceramic capacitor package 100 according to an embodiment of the present invention. FIG. 2 is a cross-sectional view of the multi-layer ceramic capacitor package 100 taken along the A-A' line in FIG. 1. It should be noted that the configuration of the multi-layer ceramic capacitor package 100 according to this embodiment is not limited to the configuration shown in FIGS. 1 and 2.

As shown in FIG. 1, the multi-layer ceramic capacitor package 100 is formed in a long shape.

As shown in FIG. 2, the multi-layer ceramic capacitor package 100 includes a housing portion 110, a sealing portion 120, and a multi-layer ceramic capacitor 10. As shown in FIG. 1, the housing portion 110 includes a plurality of recesses 100b in a Y-axis direction at predetermined intervals therebetween.

As shown in FIGS. 1 and 2, each of the recesses 100b houses the multi-layer ceramic capacitor 10 and includes a take-out opening 100a through which the multi-layer ceramic capacitor 10 is taken out of the housing portion 110.

The housing portion 110 according to this embodiment is typically a carrier tape, but the housing portion 110 is not limited thereto and may be a chip tray in which the recesses 100b each housing the multi-layer ceramic capacitor 10 are arranged in a lattice form, or the like. Further, a material forming the housing portion 110 is also not particularly limited and may be a synthetic resin, paper, and the like.

As shown in FIG. 2, the sealing portion 120 is laminated on the housing portion 110 and covers the take-out opening 100a of the recess 100b in a Z-axis direction. With this configuration, the sealing portion 120 seals the recess 100b in which the multi-layer ceramic capacitor 10 is housed. Further, the sealing portion 120 according to this embodiment is configured to be capable of being peeled off from the housing portion 110 in the Z-axis direction.

The sealing portion 120 according to this embodiment is typically a cover tape, but the sealing portion 120 is not limited thereto. The sealing portion 120 is not particularly limited as long as it is a member that is laminated so as to be capable of being peeled off from the housing portion 110 and that has a function of sealing the recess 100b.

Further, a material forming the sealing portion 120 is also not particularly limited and may be a synthetic resin, paper, and the like. Furthermore, the sealing portion 120 may be made of the same type of material as the housing portion 110 or may be made of a different material.

The multi-layer ceramic capacitor 10 is housed one by one in each of the recesses 100b provided in the housing portion 110. Here, in the multi-layer ceramic capacitor package 100 according to this embodiment, as shown in FIG. 2, a convexly-curved surface of the multi-layer ceramic capacitor 10 faces toward the take-out opening 100a. The multi-layer ceramic capacitor 10 will be described later.

It should be noted that the multi-layer ceramic capacitor 10 shown in FIG. 2 is illustrated with emphasis on its curved shape for the purpose of description, but in reality the multi-layer ceramic capacitor 10 is not curved as extremely as that of FIG. 2. The same holds true for FIGS. 4, 6, 9, and 10 to be described later.

2. Configuration of Multi-layer Ceramic Capacitor 10

Figure 3:
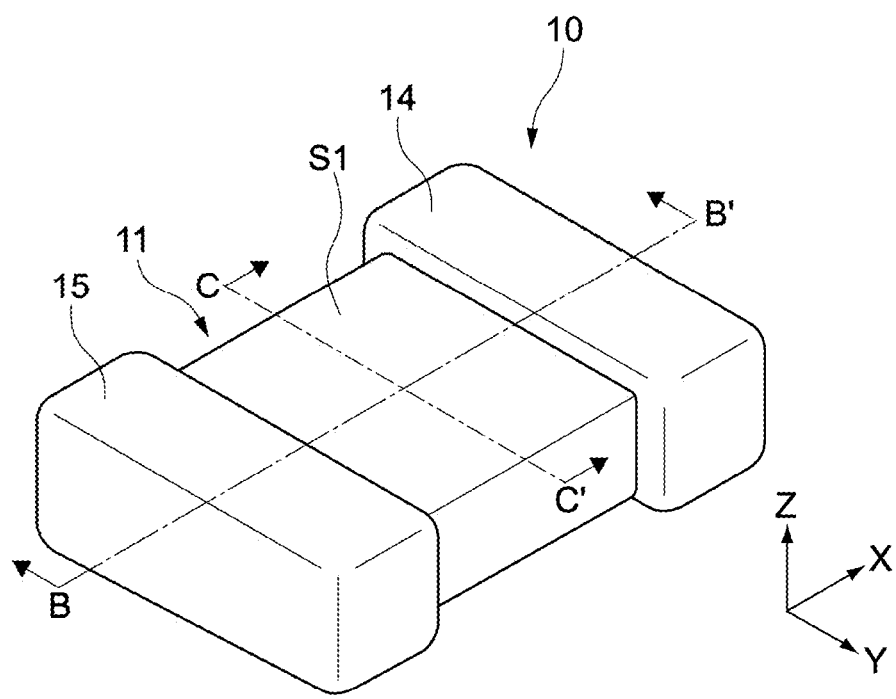
FIG. 3 is a perspective view of a multi-layer ceramic capacitor according to the embodiment.
Figure 4:
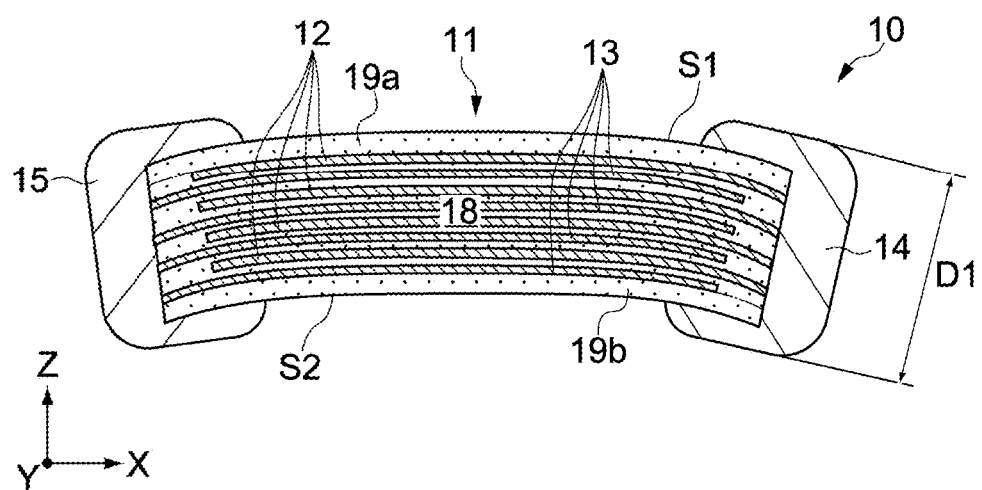
FIG. 4 is a cross-sectional view of the multi-layer ceramic capacitor taken along the B-B' line in FIG. 3.
Figure 5:
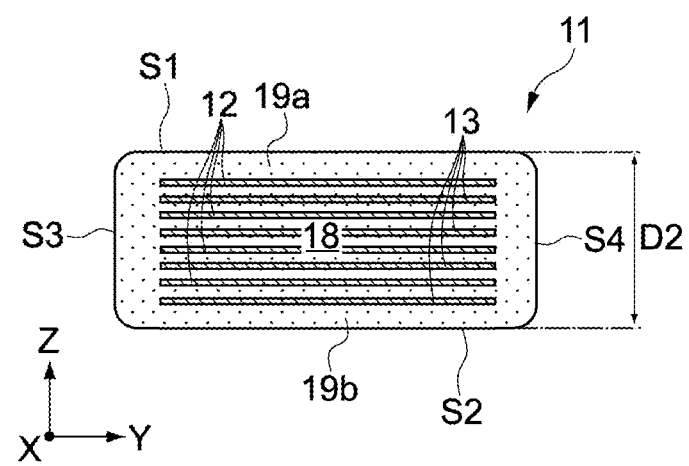
FIG. 5 is a cross-sectional view of the multi-layer ceramic capacitor taken along the C-C' line in FIG. 3.

FIGS. 3 to 5 are views of the multi-layer ceramic capacitor 10 according to the embodiment of the present invention. FIG. 3 is a perspective view of the multi-layer ceramic capacitor 10. FIG. 4 is a cross-sectional view of the multi-layer ceramic capacitor 10 taken along the B-B' line in FIG. 3. FIG. 5 is a cross-sectional view of the multi-layer ceramic capacitor 10 taken along the C-C' line in FIG. 3.

The multi-layer ceramic capacitor 10 includes a body 11, a first external electrode 14, and a second external electrode 15.

Typically, the body 11 has main surfaces S1 and S2 oriented in the Z-axis direction and two side surfaces S3 and S4 oriented in the Y-axis direction. Ridges connecting the respective surfaces of the body 11 are chamfered. It should be noted that the shape of the body 11 is not limited to the shape as described above.

The first external electrode 14 and the second external electrode 15 cover both end surfaces of the body 11 that are oriented in an X-axis direction, and extend to four surfaces that are connected to both the end surfaces oriented in the X-axis direction. With this configuration, both of the first external electrode 14 and the second external electrode 15 have U-shaped cross sections in parallel with an X-Z plane and an X-Y plane.

The total thickness of the multi-layer ceramic capacitor 10, i.e., a dimension D1 in the Z-axis direction (the total of a dimension of the first and second external electrodes 14 and 15 in the Z-axis direction on the main surfaces S1 and S2 of the body 11 and a dimension D2 of the body 11 in the Z-axis direction) is, for example, approximately several tens of μm, and is desirably 40 μm or less. Further, in this embodiment, the dimension D2 of the body 11 in the Z-axis direction is 50 μm or less, and desirably 30 μm or less.

In this case, an aspect ratio of the body 11 (ratio of the dimension D2 to the dimension of the body 11 in the X-axis direction) is desirably set to 0.2 or less.

The body 11 includes a capacitance forming unit 18, a first cover 19a, and a second cover 19b.

The body 11 has a configuration in which a plurality of ceramic layers are laminated in the Z-axis direction.

The capacitance forming unit 18 includes a plurality of first internal electrodes 12 and a plurality of second internal electrodes 13. The first internal electrodes 12 and the second internal electrodes 13 are alternately disposed between the ceramic layers along the Z-axis direction. The first internal electrodes 12 are connected to the first external electrode 14 and are insulated from the second external electrode 15. The second internal electrodes 13 are connected to the second external electrode 15 and are insulated from the first external electrode 14.

The first internal electrodes 12 and the second internal electrodes 13 are each made of an electrical conductive material and function as internal electrodes of the multi-layer ceramic capacitor 10. Examples of the electrical conductive material include a metal material containing nickel (Ni), copper (Cu), palladium (Pd), platinum (Pt), silver (Ag), gold (Au), or an alloy of them. Typically, a metal material mainly containing nickel (Ni) is employed.

The capacitance forming unit 18 is made of ceramics. In the capacitance forming unit 18, in order to increase capacitances of the ceramic layers provided between the first internal electrodes 12 and the second internal electrodes 13, a material having a high dielectric constant is used as a material forming the ceramic layers. For the capacitance forming unit 18, for example, polycrystal of a barium titanate ($BaTiO_3$) based material, i.e., polycrystal having a Perovskite structure containing barium (Ba) and titanium (Ti) can be used.

Alternatively, the capacitance forming unit 18 may be made of polycrystal of a strontium titanate ($SrTiO_3$) based material, a calcium titanate ($CaTiO_3$) based material, a magnesium titanate ($MgTiO_3$) based material, a calcium zirconate ($CaZrO_3$) based material, a calcium zirconate titanate ($Ca(Zr,Ti)O_3$) based material, a barium zirconate ($BaZrO_3$) based material, a titanium oxide ($TiO_2$) based material, or the like.

The first cover 19a and the second cover 19b respectively cover the upper surface and the lower surface of the capacitance forming unit 18 in the Z-axis direction. Further, the first cover 19a has the main surface S1, and the second cover 19b has the main surface S2. The first cover 19a and the second cover 19b are not provided with the first internal electrodes 12 and the second internal electrodes 13.

The first cover 19a and the second cover 19b are made of ceramics. A material forming the first cover 19a and the second cover 19b is insulating ceramics. Use of ceramics having a composition system common to that of the capacitance forming unit 18 leads to suppression of internal stress in the body 11.

The capacitance forming unit 18, the first cover 19a, and the second cover 19b may further contain one or more types of metal elements such as magnesium (Mg), manganese (Mn), aluminum (Al), calcium (Ca), vanadium (V), chromium (Cr), zirconium (Zr), molybdenum (Mo), tungsten (W), tantalum (Ta), niobium (Nb), silicon (Si), boron (B), yttrium (Y), europium (Eu), gadolinium (Gd), dysprosium (Dy), holmium (Ho), erbium (Er), ytterbium (Yb), lithium (Li), potassium (K), and sodium (Na), other than barium (Ba) and titanium (Ti), for example.

With the configuration described above, when a voltage is applied between the first external electrode 14 and the second external electrode 15 in the multi-layer ceramic capacitor 10, the voltage is applied to the ceramic layers between the first internal electrodes 12 and the second internal electrodes 13. With this configuration, the multi-layer ceramic capacitor 10 stores charge corresponding to the voltage applied between the first external electrode 14 and the second external electrode 15.

It should be noted that the multi-layer ceramic capacitor 10 according to this embodiment only needs to include the capacitance forming unit 18, the first cover 19a, and the second cover 19b, and other configurations can be changed as appropriate. For example, the number of first internal electrodes 12 and second internal electrodes 13 can be determined as appropriate according to the size and performance expected for the multi-layer ceramic capacitor 10.

Further, in FIGS. 4 and 5, in order to make the facing state of the first and second internal electrodes 12 and 13 easily viewable, the number of first internal electrodes 12 and the number of second internal electrodes 13 are each set to four. However, actually, more first and second internal electrodes 12 and 13 are provided so as to ensure the capacitance of the multi-layer ceramic capacitor 10.

Figure 6:
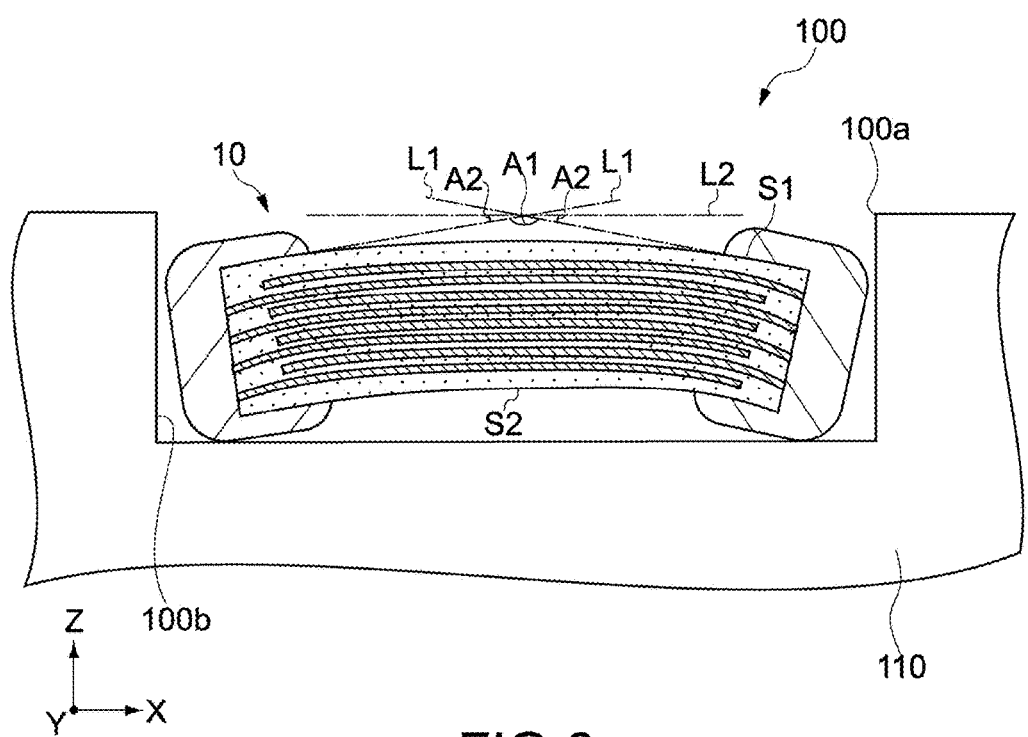
FIG. 6 is an enlarged schematic view of an area E of the multi-layer ceramic capacitor package shown in FIG. 2.

FIG. 6 is an enlarged schematic view of an area E shown in FIG. 2. It should be noted that FIG. 6 omits illustration of the sealing portion 120.

The multi-layer ceramic capacitor 10 housed in the housing portion 110 of the multi-layer ceramic capacitor package 100 has, as shown in FIG. 6, a curved shape that is convex upwardly in the Z-axis direction along the X-axis direction (longitudinal direction). In other words, as shown in FIG. 6, in the multi-layer ceramic capacitor 10, the main surface S1 facing in the Z-axis direction is convexly curved along the X-axis direction, and the main surface S2 on the opposite side of the main surface S1 is concavely curved along the X-axis direction.

In particular, in the multi-layer ceramic capacitor 10 according to this embodiment, an angle A1 formed by tangent lines L1 that are tangent to the ends of the main surface S1 in the X-axis direction is desirably set to 170° or more and 176° or less. In other words, an angle A2 formed by a virtual line L2 parallel to the X-axis direction of the multi-layer ceramic capacitor 10 and the tangent line L1 is desirably set to 2° or more and 5° or less.

Here, in the multi-layer ceramic capacitor package 100 according to this embodiment, as shown in FIG. 6, the multi-layer ceramic capacitor 10 is housed in the recess 100b with the convexly-curved main surface S1 facing toward the take-out opening 100a.

This improves the flexural strength of the multi-layer ceramic capacitor 10 against stress applied from the main surface S1 side, although the multi-layer ceramic capacitor 10 has a low-profile configuration in which the dimension D2 of the body 11 in the Z-axis direction is 50 μm or less.

Specifically, in the multi-layer ceramic capacitor 10, the flexural strength is improved by approximately 20% as compared to a multi-layer ceramic capacitor with a normal configuration in which the body 11 is not curved.

Therefore, for example, in an assembling step of a circuit board and the like, when the multi-layer ceramic capacitor 10 is taken out through the take-out opening 100a with a chip mounter or the like and mounted onto a substrate or the like, even if strong stress is applied to the multi-layer ceramic capacitor 10 from the main surface S1 side, damage on the multi-layer ceramic capacitor 10 is suppressed.

In other words, the multi-layer ceramic capacitor package 100 according to this embodiment houses the multi-layer ceramic capacitor 10 such that the convexly-curved main surface S1 faces toward the take-out opening 100a, thus obtaining a configuration to house the multi-layer ceramic capacitor 10 in which both of the reduction in height and the ensuring of the flexural strength are achieved. The direction of the curve of the multi-layer ceramic capacitor 10 can be sorted by, for example, image processing.

3. Method of Producing Multi-layer Ceramic Capacitor 10

Figure 7:
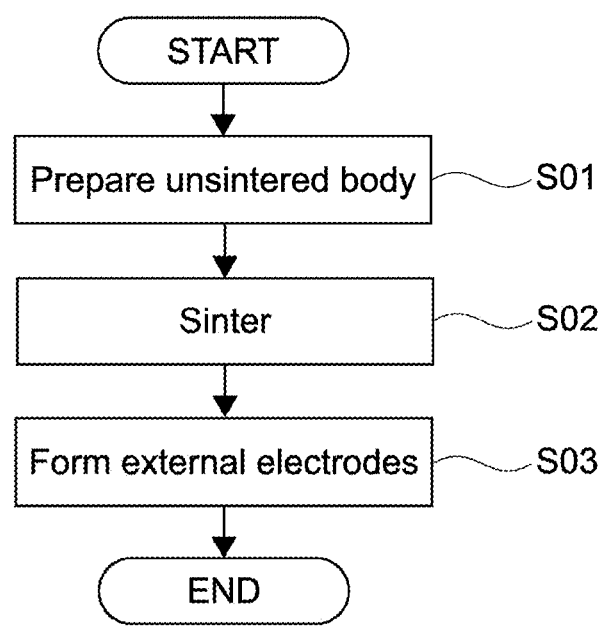
FIG. 7 is a flowchart showing a method of producing the multi-layer ceramic capacitor.
Figure 8:
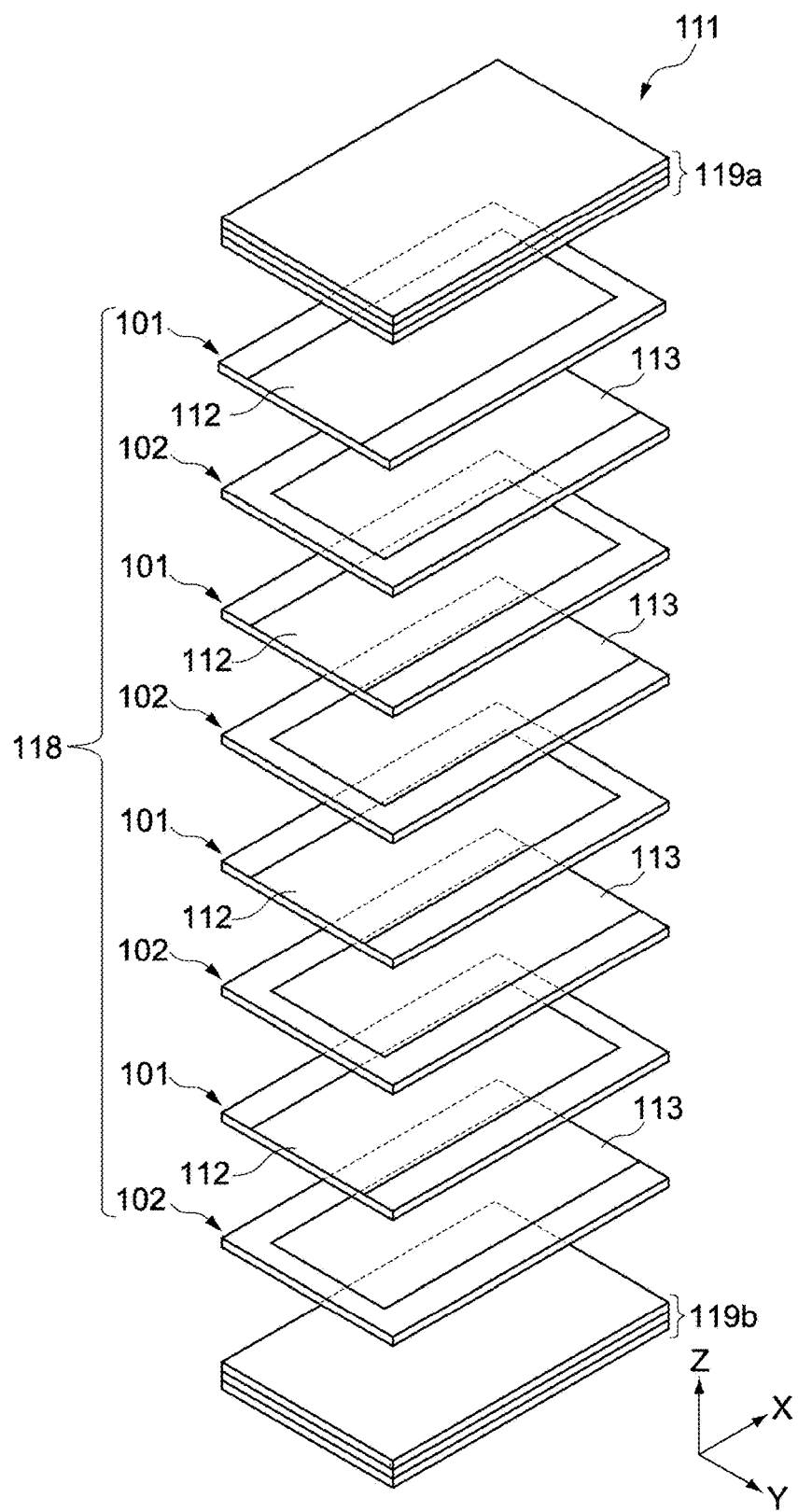
FIG. 8 is an exploded perspective view showing a production process of the multi-layer ceramic capacitor.
Figure 9:
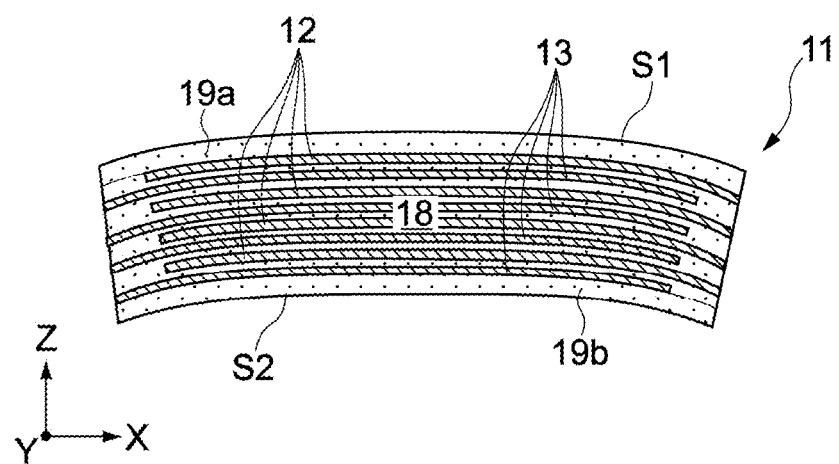
FIG. 9 is a cross-sectional view showing the production process of the multi-layer ceramic capacitor.

FIG. 7 is a flowchart showing a method of producing the multi-layer ceramic capacitor 10. FIGS. 8 and 9 are views each showing a production process of the multi-layer ceramic capacitor 10. Hereinafter, the method of producing the multi-layer ceramic capacitor 10 will be described along FIG. 7 with reference to FIGS. 8 and 9 as appropriate.

3.1 Step S01: Preparation of Unsintered Body

In Step S01, an unsintered body 111, which is to be the base of the body 11, is prepared. FIG. 8 is an exploded perspective view of the body 111. For the purpose of description, FIG. 8 shows first ceramic layers 101, second ceramic layers 102, a first cover 119a, and a second cover 119b in an exploded manner. However, the first and second ceramic layers 101 and 102 and the first and second covers 119a and 119b are integrated in the actual body 111.

As shown in FIG. 8, the body 111 includes an unsintered capacitance forming unit 118 corresponding to the capacitance forming unit 18, the unsintered first cover 119a corresponding to the first cover 19a, and the unsintered second cover 119b corresponding to the second cover 19b. As shown in FIG. 8, the capacitance forming unit 118 has a configuration in which the first ceramic layers 101 and the second ceramic layers 102 are alternately laminated in the Z-axis direction.

The first cover 119a and the second cover 119b are respectively laminated on the upper surface and the lower surface of the capacitance forming unit 118 in the Z-axis direction. The thickness of each of the first ceramic layer 101, the second ceramic layer 102, the first cover 119a, and the second cover 119b is not particularly limited, but it is desirably set to 0.5 µm or more and 3.0 µm or less.

Here, in this embodiment, insulating ceramic particles aggregate at a higher density in one of the covers than in the other cover, out of the first cover 119a and the second cover 119b that cover the upper surface and the lower surface of the capacitance forming unit 118 in the Z-axis direction.

It should be noted that in the example shown in FIG. 8, the capacitance forming unit 118 includes the four first ceramic layers 101 and the four second ceramic layers 102, and each of the first cover 119a and the second cover 119b includes three ceramic layers, but the present invention is not limited thereto. The number of first ceramic layers 101 and second ceramic layers 102 and the number of ceramic layers forming the first cover 119a and the second cover 119b can be changed as appropriate.

Further, unsintered first internal electrodes 112 corresponding to the first internal electrodes 12 are formed on the first ceramic layers 101, and unsintered second internal electrodes 113 corresponding to the second internal electrodes 13 are formed on the second ceramic layers 102. It should be noted that no unsintered internal electrodes are formed on the first cover 119a and the second cover 119b. In the body 111, the first internal electrodes 112 are exposed to one of the end surfaces in the X-axis direction, and the second internal electrodes 113 are exposed to the other end surface.

The first and second internal electrodes 112 and 113 can be formed using an electrical conductive paste containing nickel (Ni), for example. For formation of the first and second internal electrodes 112 and 113 by use of an electrical conductive paste, a screen printing method or a gravure printing method can be used, for example.

3.2 Step S02: Sintering

In Step S02, the unsintered body 111 obtained in Step S01 is sintered to produce the body 11 of the multi-layer ceramic capacitor 10 shown in FIGS. 3 to 5.

In other words, in Step S02, the first internal electrodes 112 and the second internal electrodes 113 respectively become the first internal electrodes 12 and the second internal electrodes 13, the capacitance forming unit 118 becomes the capacitance forming unit 18, and the first cover 119a and the second cover 119b respectively become the first cover 19a and the second cover 19b.

A sintering temperature for the body 111 in Step S02 can be determined on the basis of a sintering temperature for the capacitance forming unit 118, the first cover 119a, and the second cover 119b. For example, when a barium titanate ($BaTiO_3$) based material is used as ceramics, the sintering temperature for the body 111 can be set to approximately 1,000 to 1,400° C. Further, sintering can be performed in a reduction atmosphere or a low-oxygen partial pressure atmosphere, for example.

Here, in the body 111 obtained in Step S01 described above, insulating ceramic particles aggregate at a higher density in one of the covers than in the other cover, out of the first cover 119a and the second cover 119b that cover the capacitance forming unit 118 in the Z-axis direction.

This makes a shrink percentage at the time of sintering of the unsintered body 111 different between the first cover 119a and the second cover 119b. One of the first cover 119a and the second cover 119b that has a lower density of the ceramic particles shrinks more than the other cover that has a higher density of the ceramic particles.

Therefore, in Step S02, the unsintered body 111 is sintered, thus obtaining the body 11 with a curved shape along the X-axis direction (longitudinal direction).

FIG. 9 is a cross-sectional view of the sintered body 11. The body 11, which is obtained by sintering the body 111 according to this embodiment, has the main surface S1 convexly curved along the X-axis direction, and the main surface S2 on the opposite side of the main surface S1, which is concavely curved along the X-axis direction, as shown in FIG. 9.

3.3 Step S03: Formation of External Electrodes

In Step S03, the first external electrode 14 and the second external electrode 15 are formed on the body 11 obtained in Step S02, to produce the multi-layer ceramic capacitor 10 shown in FIGS. 3 to 5.

In Step S03, first, an unsintered electrode material is applied so as to cover one of the end surfaces of the body 11 and then applied so as to cover the other one of the end surfaces of the body 11, the end surfaces being oriented in the X-axis direction. The applied unsintered electrode materials are subjected to baking in a reduction atmosphere or a low-oxygen partial pressure atmosphere, for example, to form base films on the body 11. On the base films baked onto the body 11, intermediate films and surface films are formed by plating such as electrolytic plating. Thus, the first external electrode 14 and the second external electrode 15 are completed.

A method of forming the base films on the body 11 is not particularly limited as long as a thin film can be formed on the body 11 by the method. For example, sputtering, spray coating, printing, and the like can be employed.

It should be noted that part of the processing in Step S03 described above may be performed before Step S02. For example, before Step S02, the unsintered electrode material may be applied to both the end surfaces of the unsintered body 111 that are oriented in the X-axis direction, and in Step S02, the unsintered body 111 may be sintered and, simultaneously, the unsintered electrode material may be baked to form base films of the first external electrode 14 and the second external electrode 15.

3.4 Modified Example

The method of producing the multi-layer ceramic capacitor 10 is not limited to the production method described above, and the production steps may be changed or added as appropriate.

For example, in the production method described above, the density of the insulating ceramics is made different between the first cover 119a and the second cover 119b in the unsintered body 111, to generate curves at the time of sintering of the body 111. However, the present invention is not limited to the above method.

Specifically, at the time of sintering of the body 111, the amount of heat to be transmitted to the first cover 119a and the second cover 119b may be made different, to generate curves in the body 11.

Alternatively, the content of an additive element, e.g., magnesium (Mg), manganese (Mn), aluminum (Al), calcium (Ca), vanadium (V), chromium (Cr), zirconium (Zr), molybdenum (Mo), tungsten (W), tantalum (Ta), niobium (Nb), silicon (Si), boron (B), yttrium (Y), europium (Eu), gadolinium (Gd), dysprosium (Dy), holmium (Ho), erbium (Er), ytterbium (Yb), lithium (Li), potassium (K), or sodium (Na), which is contained in the first cover 119a and the second cover 119b of the body 111, a particle diameter of the ceramic particles, and the like may be made different, and the sintering performance may thus be made different between the first cover 119a and the second cover 119b, to generate curves in the body 11. It should be noted that in this embodiment, at least one of the metal elements exemplified above is selected as the additive element.

4. Method of Producing Multi-layer Ceramic Capacitor Package 100

Next, a method of producing the multi-layer ceramic capacitor package 100 according to this embodiment will be described.

First, the housing portion 110 including the plurality of recesses 100b each including the take-out opening 100a is prepared. The plurality of recesses 100b can be formed by performing air-pressure forming, press forming, vacuum forming, or the like on a predetermined base material.

Next, the plurality of multi-layer ceramic capacitors 10 produced by the production method described above are prepared. Those multi-layer ceramic capacitors 10 are then housed individually in the plurality of recesses 100b such that the convexly-curved main surfaces S1 face to the respective take-out openings 100a.

Incidentally, the sintered body 11 has a shape curved along the longitudinal direction as shown in FIG. 9. One of the causes leading to such a shape resides in that the first cover 119a and the second cover 119b of the unsintered body 111 has different sintering performance.

Therefore, in the sintered body 11, the main surface S1 and the main surface S2 have different colors in some cases. Here, in this embodiment, the difference in color in the body 11 may be used as an index with which the main surface S1 and the main surface S2 are distinguished from each other. This enables the convexly-curved main surface S1 and the concavely-curved main surface S2 of the multi-layer ceramic capacitor 10 to be easily distinguished from each other.

Subsequently, the sealing portion 120 is attached to the housing portion 110, to seal the plurality of recesses 100b individually housing the plurality of multi-layer ceramic capacitors 10. This provides the multi-layer ceramic capacitor package 100 as shown in FIGS. 1 and 2.

In this embodiment, when the multi-layer ceramic capacitor package 100 is produced by the production method described above, each multi-layer ceramic capacitor 10 is housed in this package 100 with the convex main surface S1 facing toward the take-out opening 100a. This can provide the action and effect described above.

5. Examples

Hereinafter, Examples of the present invention will be described.

5.1 Preparation of Multi-layer Ceramic Capacitor

Samples of multi-layer ceramic capacitors according to Example 1 and Comparative Example 2 were produced by the production method described above. Further, a sample of a multi-layer ceramic capacitor according to Comparative Example 1 was prepared.

The samples according to Example 1 and Comparative Example 2 have a shape in which the body 11 is curved along the longitudinal direction (see FIG. 9). The sample according to Comparative Example 1 is a multi-layer ceramic capacitor with a normal configuration in which the body is not curved. The sample according to Comparative Example 1 has a common configuration with the samples according to Example 1 and Comparative Example 2 except that the body is not curved.

5.2 Calculation of Flexural Strength

Figure 10:
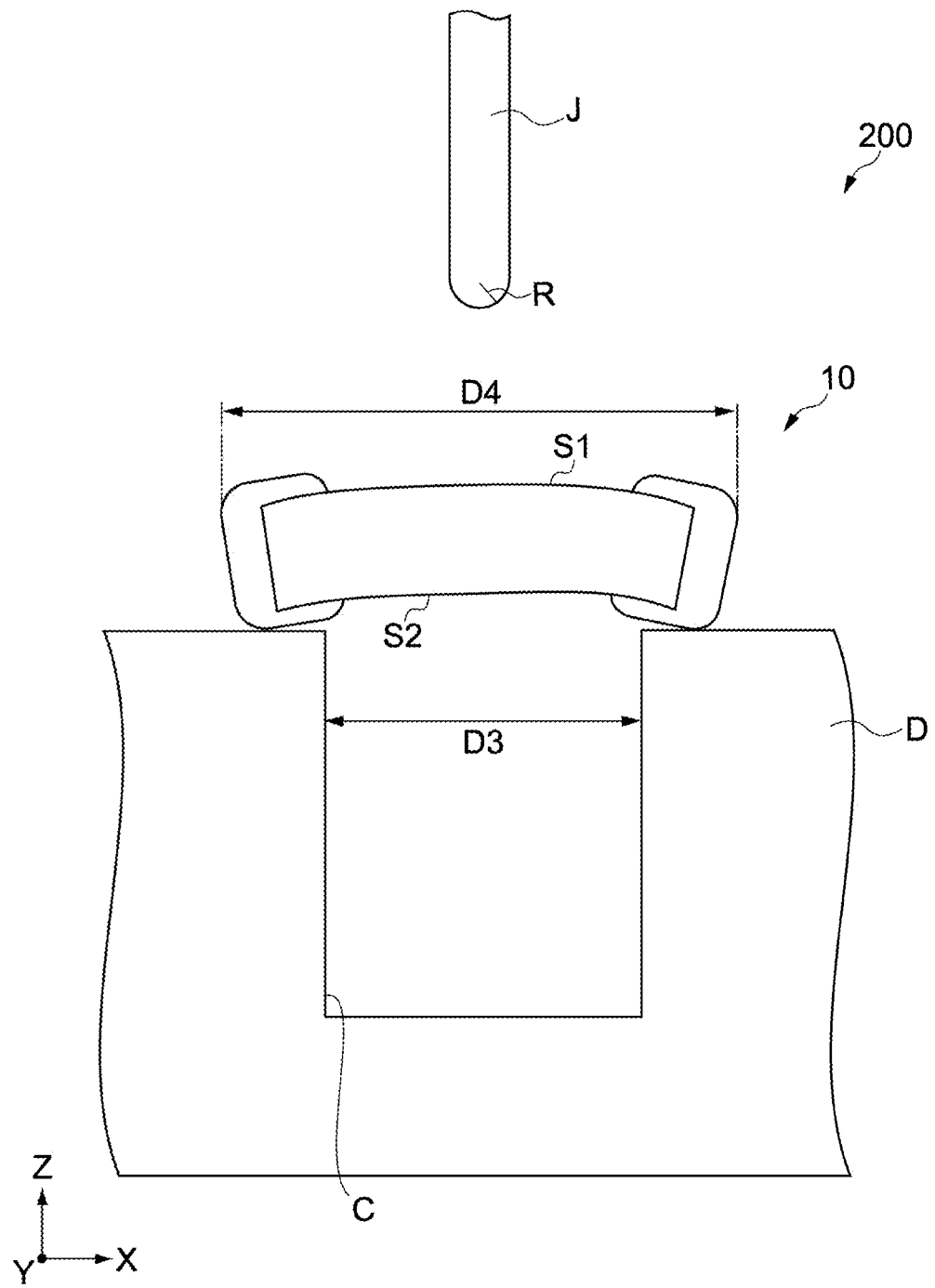
FIG. 10 is a schematic view of a measurement apparatus for calculating flexural strength of samples according to Examples of the present invention.

Next, flexural strength was calculated for the samples of the multi-layer ceramic capacitors according to Example 1 and Comparative Examples 1 and 2. FIG. 10 is a schematic view of a measurement apparatus 200 for calculating flexural strength of the samples according to Example 1 and Comparative Examples 1 and 2.

As shown in FIG. 10, the measurement apparatus 200 includes a base D and a pusher J. The base D includes a recess C. A dimension D3 of the recess C in the X-axis direction is 0.6 times as large as a dimension D4 of each sample in the X-axis direction. Further, a radius R of the fulcrum of the pusher J is 500 μm.

Example 1

First, as shown in FIG. 10, the multi-layer ceramic capacitor 10 was placed on the base D such that the recess C was disposed at the center of the multi-layer ceramic capacitor 10 in the X-axis direction. At that time, in Example 1, as shown in FIG. 10, the multi-layer ceramic capacitor 10 was placed such that the convexly-curved main surface S1 faced the pusher J along the Z-axis direction, and the concavely-curved main surface S2 faced the recess C along the Z-axis direction.

Next, the pusher J was moved in the Z-axis direction and caused to abut against the main surface S1. Subsequently, the pusher J was caused to push the multi-layer ceramic capacitor 10 at a loading rate of 10 mm/min, and the maximum load to the breaking of the multi-layer ceramic capacitor 10 was measured. The flexural strength of the multi-layer ceramic capacitor 10 according to Example 1 was then calculated on the basis of the maximum load.

Comparative Example 1

The flexural strength of the multi-layer ceramic capacitor according to Comparative Example 1 was calculated by the approach similar to Example 1.

Comparative Example 2

In Comparative Example 2, the flexural strength of the multi-layer ceramic capacitor according to Comparative Example 2 was calculated by the approach similar to Example 1 except the following point.

A difference from Example 1 is that, in Comparative Example 2, the multi-layer ceramic capacitor was placed on the base D such that the convexly-curved main surface S1 faced the recess C along the Z-axis direction, and the concavely-curved main surface S2 faced the pusher J along the Z-axis direction.

5.3 Calculation Results

Figure 11:
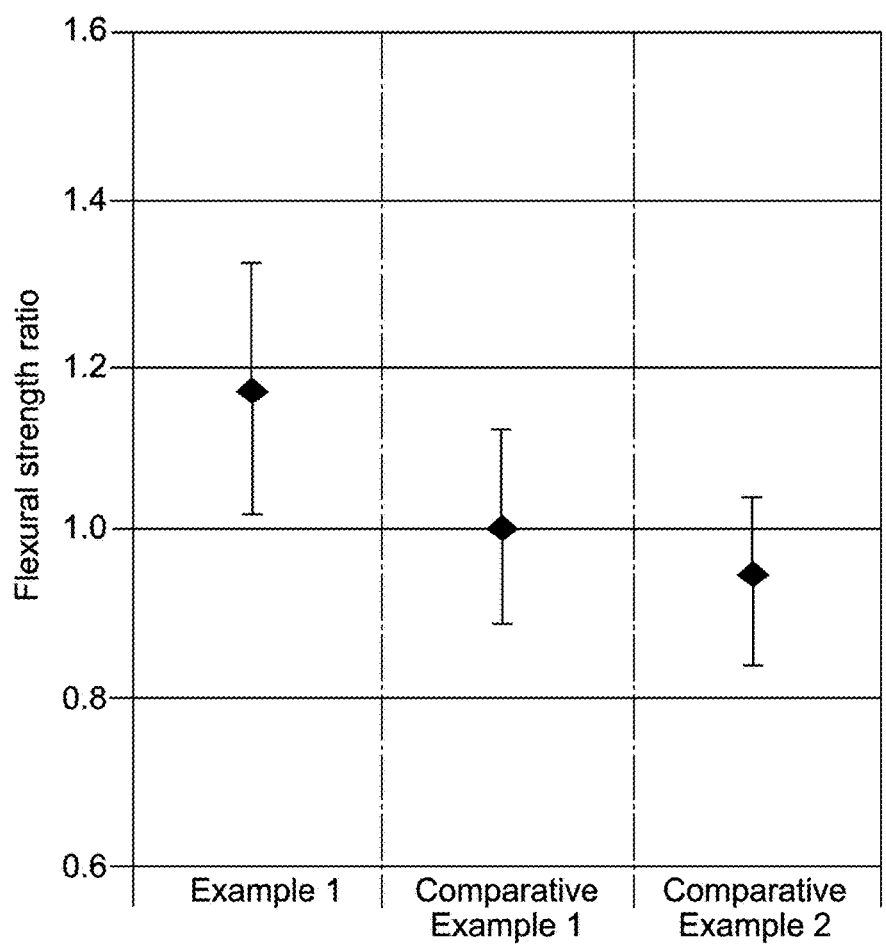
FIG. 11 is a graph of the flexural strength of the samples.

FIG. 11 is a graph of the flexural strength of the samples of the multi-layer ceramic capacitors according to Example 1 and Comparative Examples 1 and 2. It should be noted that a "flexural strength ratio" shown in FIG. 11 refers to a standardized value with "1" being set for the flexural strength of the multi-layer ceramic capacitor according to Comparative Example 1.

Referring to FIG. 11, it was confirmed that the flexural strength of the sample according to Example 1 is larger than the flexural strength of the samples according to Comparative Examples 1 and 2.

From those results, it was experimentally confirmed that when the multi-layer ceramic capacitor package 100 according to the embodiment described above houses the multi-layer ceramic capacitor 10 such that the convexly-curved main surface S1 faces toward the take-out opening 100a, the flexural strength against the stress applied from the main surface S1 side of the multi-layer ceramic capacitor 10 is improved.

6. Other Embodiments

While the embodiment of the present invention has been described hereinabove, the present invention is not limited to the embodiment described above, and it should be appreciated that the present invention may be variously modified.

For example, in the multi-layer ceramic capacitor 10, the capacitance forming unit 18 may be divided into capacitance forming units in the Z-axis direction. In this case, in each capacitance forming unit 18, the first internal electrodes 12 and the second internal electrodes 13 only need to be alternately disposed along the Z-axis direction. In a portion where the capacitance forming units 18 are next to each other, the first internal electrodes 12 or the second internal electrodes 13 may be continuously disposed.

Further, in the embodiment described above, the multi-layer ceramic capacitor has been described as an example of a multi-layer ceramic electronic component, but the present invention can also be applied to a chip varistor, a chip thermistor, a multi-layer inductor, or the like.

Furthermore, the electronic component of the electronic component package according to the present invention may be a ceramic electronic component including no multi-layer structure. In addition, the electronic component of the electronic component package according to the present invention may be an electronic component made of a material other than ceramics, such as an alloy or resin. Those configurations can also provide the action and effect similar to that described above.

What is claimed is:

1. An electronic component package, comprising:
    a plurality of electronic components each including a body,
    the body having a first main surface that is convexly curved along a longitudinal direction, and a second main surface that is concavely curved along the longitudinal direction, a distance between the first main surface and the second main surface being 50 μm or less;
    a carrier tape that includes a plurality of recesses, each of the recesses including a take-out opening and respectively housing an electronic component of the plurality of electronic components with the first main surface facing toward the take-out opening; and
    a cover tape that covers the take-out openings of the plurality of recesses and is configured to be capable of being peeled off;
    wherein each electronic component includes a ceramic electronic component,
    wherein the ceramic electronic component includes a multi-layer ceramic electronic component that is made of insulating ceramics and includes a first cover and a second cover, the first cover forming the first main surface, the second cover forming the second main surface,
    wherein an angle formed by tangent lines that are tangent to ends of the first main surface in the longitudinal direction is 170° or more and 176° or less, and an angle formed by a virtual line parallel to the longitudinal direction of the multi-layer ceramic capacitor and the tangent line is 2° or more and 5° or less.

2. The electronic component package according to claim 1, wherein the first cover and the second cover are different from each other in particle density of the insulating ceramics.

3. The electronic component package according to claim 1, wherein the first cover and the second cover are different from each other in particle diameter of the insulating ceramics.

4. The electronic component package according to claim 1, wherein the first cover and the second cover are different from each other in content of an additive element therein.

5. The electronic component package according to claim 4, wherein
    the additive element is at least one element selected from magnesium, manganese, aluminum, calcium, vanadium, chromium, zirconium, molybdenum, tungsten, tantalum, niobium, silicon, boron, yttrium, europium, gadolinium, dysprosium, holmium, erbium, ytterbium, lithium, potassium, and sodium.

6. A method of housing an electronic component, comprising:

preparing a carrier tape that includes a plurality of recesses, each of the recesses including a take-out opening;

preparing a plurality of electronic components, each of the electronic components including a body having a first main surface convexly curved along a longitudinal direction and a second main surface concavely curved along the longitudinal direction, a distance between the first main surface and the second main surface being 50 µm or less; and housing the plurality of electronic components respectively in the plurality of recesses such that each first main surface faces toward the take-out opening corresponding thereto; and covering the take-out openings of the plurality of recesses with a cover tape configured to be capable of being peeled off, wherein each electronic component includes a ceramic electronic component, wherein the ceramic electronic component includes a multi-layer ceramic electronic component that is made of insulating ceramics and includes a first cover and a second cover, the first cover forming the first main surface, the second cover forming the second main surface, wherein an angle formed by tangent lines that are tangent to ends of the first main surface in the longitudinal direction is 170° or more and 176° or less, and an angle formed by a virtual line parallel to the longitudinal direction of the multi-layer ceramic capacitor and the tangent line is 2° or more and 5° or less.

\* \* \* \* \*